United States Patent [19]
Goossens et al.

[11] Patent Number: 5,551,309
[45] Date of Patent: Sep. 3, 1996

[54] COMPUTER-CONTROLLED CHEMICAL DISPENSING WITH ALTERNATIVE OPERATING MODES

[75] Inventors: Dirk Goossens, Sint Niklaas, Belgium; Herman J. Boeglin, South Meriden, Conn.

[73] Assignee: Olin Corporation, Cheshire, Conn.

[21] Appl. No.: 374,000

[22] Filed: Jan. 17, 1995

[51] Int. Cl.⁶ ..................................... G02D 7/06
[52] U.S. Cl. ............................... 73/863; 137/113
[58] Field of Search ............................. 73/863; 137/112, 137/113, 571, 572, 386, 393, 395, 403, 602, 605

[56] References Cited

U.S. PATENT DOCUMENTS

| | | |
|---|---|---|
| 3,901,182 | 8/1975 | Chiang . |
| 4,134,514 | 1/1979 | Schumacher et al. . |
| 4,220,460 | 9/1980 | Partus . |
| 4,247,018 | 1/1981 | Cradle ........................ 137/113 |
| 4,276,243 | 6/1981 | Partus . |
| 4,298,037 | 11/1981 | Schumacher et al. . |
| 4,393,013 | 7/1983 | McMenamin . |
| 4,436,674 | 3/1984 | McMenamin . |
| 4,487,619 | 12/1984 | Jones . |
| 4,582,480 | 4/1986 | Lynch et al. . |
| 4,612,772 | 9/1986 | Jones . |
| 4,619,072 | 10/1986 | Privett . |
| 4,851,821 | 7/1989 | Howard et al. . |
| 4,859,357 | 8/1989 | Lipisko et al. . |
| 4,886,178 | 12/1989 | Graf . |
| 4,979,545 | 12/1990 | Fair . |
| 4,979,643 | 12/1990 | Lipisko et al. . |
| 5,038,840 | 8/1991 | Fair . |
| 5,041,267 | 8/1991 | Randtke et al. . |
| 5,279,338 | 1/1994 | Goossens . |
| 5,293,893 | 3/1994 | O'Dougherty ................ 137/113 |

Primary Examiner—Robert Raevis
Attorney, Agent, or Firm—William A. Simons

[57] ABSTRACT

Liquid chemical supply ampules, commonly called "bubblers", which are used in semiconductor and fiber optic component production lines are automatically refilled without the need to interrupt operation of the production lines. The bubbler ampules utilize a supply of the liquid chemicals from which the ampules produce a gas stream which is saturated with the chemicals. An individual ampule will be connected by means of a selectively operable series of transfer valves to two separate chemical bulk supply tanks. The bulk supply tanks can include one fixed and one replaceable tank; or two replaceable tanks. A chemical supply system is operated by a microprocessor controller which is programmed to be able to selectively manipulate the transfer valves so as to supply the bubbler ampule with chemicals from the fixed bulk tank, and to refill the fixed tank with chemicals from the replaceable tank; or alternatively, the controller can manipulate the transfer valves so as to supply chemicals to the bubbler ampule, first from one replaceable tank, and then from the other replaceable tank. The system is thus able to operate production lines which use either one fixed bulk chemical supply tank and one replaceable bulk chemical supply tank; or two replaceable bulk chemical supply tanks.

3 Claims, 4 Drawing Sheets

COMPUTER-CONTROLLED CHEMICAL DISPENSING WITH ALTERNATIVE OPERATING MODES

BACKGROUND OF THE INVENTION

1. Field of the Invention

This invention relates to a system for supplying high purity chemicals to a semiconductor, fiber optic, or the like, component production line. More particularly, this invention relates to a system of the character described which allows the production line to operate continuously, and without interruption.

2. Brief Description of Prior Art

Production lines for the manufacture of semiconductors, fiber optics, and the like components, typically include systems for supplying high purity processing chemicals to diffusion furnaces, either directly or in carrier gases.

The processing chemicals are liquids which may be directly injected into the processing stations, or which may be carried to the processing stations in a carrier gas. Direct chemical injection may be from bulk supply tanks, or may be from smaller supply containers which will be periodically refilled by bulk supply tanks. When the chemicals are applied by means of carrier gases, the liquid chemicals will be contained in temperature-controlled ampules, called "bubblers". A stream of an inert carrier gas, such as nitrogen, helium, or the like, is injected into the bubbler ampules. The inert carrier gas bubbles upwardly through the liquid chemical in the bubbler ampule and creates a chemical-saturated carrier gas atmosphere in the ampule in the space above the supply of liquid chemical contained therein. The chemically saturated carrier gas is continuously drawn out of the bubbler and transferred into the component processing station, such as a diffusion furnace, as noted above.

The aforesaid processing lines utilize very high purity chemicals, such as 1,1,1-trichloroethane (TCA), and tetraethylorthosilicate (TEOS); and dopants such as phosphorous oxychloride ($POCl_3$), trimethylborate, and trimethylphosphate. The processing lines depend on a continuous supply of the chemicals being delivered from the chemical source in order to operate properly and efficiently. If the supply of the processing chemicals is interrupted, the production line must be shut down, and the diffusion furnace must be placed in a "idle" mode. If the chemical ampules are depleted of processing chemicals, they must be removed from the production line and replaced with freshly filled ampules.

In order to avoid the necessity of removing a bubbler ampule from the production line, one or more bulk chemical supply containers have been incorporated into the production line. One bulk supply container is connected to the bubbler ampule and is operable to replenish the chemical as the latter is removed from the ampule. The replenishment is a periodic process wherein a production line controller periodically replenishes the amount of processing chemical contained in the ampule with chemical from the bulk supply container so that the chemical is intermittently replaced in the ampule. This bulk supply container is a fixed component of the production line and cannot be readily removed therefrom. When a single bulk supply container is used in the production line, it must be periodically refilled with processing chemicals. The line must be shut down while the bulk supply container is refilled. The line can be run for a longer time period due to the use of the bulk supply container, however, the line still must be periodically shut down when the bulk supply container is depleted.

When two bulk supply containers are used, one is a fixed container and the other is a replaceable mobile container. The ampule is replenished with chemicals from the fixed bulk container, and the fixed bulk container is refilled with chemicals from the replaceable, or shuttle, bulk container. The fixed bulk container is typically positioned on a scale or connected to a load cell so that the volume of chemical in the fixed bulk container is continuously monitored. Signals are transmitted to the system microprocessor controller which are indicative of the volume of chemical remaining in the fixed bulk container. Typically, when the fixed bulk container is seen to be 75% full, the controller activates a chemical transfer valve system which transfers chemical from the shuttle bulk container to the fixed bulk container, and when the fixed bulk container has been refilled, the controller deactivates the chemical transfer valve system. Thus, the fixed bulk supply container will be refilled several times before the shuttle supply container must be refilled. When the shuttle bulk supply container has been substantially emptied, the shuttle container is removed from the production line and is refilled at an off-site chemical supply repository, which is typically far removed from the processing plant. At the present time, there are several such chemical supply repositories in the United States.

The use of fixed and shuttle bulk chemical supply containers has proven to be functionally operative, but it would be desirable to be able to provide an alternative replenishment system for the chemical ampules; and even more desirable to provide a chemical replenishment system with a controller microprocessor which can operate the system in alternative chemical replenishment modes, one having a fixed and a replaceable bulk chemical supply containers, and the other having two replaceable bulk chemical supply containers.

BRIEF SUMMARY OF THE INVENTION

This invention relates to a chemical replenishment system of the character described which does not require one fixed bulk chemical tank and one shuttle bulk chemical tank. The system of this invention can operate with two shuttle bulk chemical tanks, or with one fixed bulk chemical tank and one shuttle bulk chemical tank. The reason that two shuttle bulk chemical tanks is desirable is because both shuttle tanks can be reconditioned and refilled, each after only one chemical depletion cycle in the production line. Stated another way, by using two shuttle tanks, tank A can be reconditioned and refilled after one operating cycle, and tank B can be reconditioned and refilled after the next operating cycle. In this way, both bulk tanks will be reconditioned and refilled on a regular basis, and one will not remain in the production line for an inordinately lengthy time period.

When the system of this invention is operated with one fixed and one shuttle bulk chemical tank, the fixed tank (tank A) will be positioned on a scale which is connected to the processing line microprocessor controller so that the controller can monitor the amount of chemical remaining in the tank at all times. The shuttle bulk chemical tank (tank B) will also be positioned on a scale, since the system is designed to be operable in both the fixed/shuttle, and the shuttle/shuttle bulk chemical tank modes. The system controller can thus selectively monitor the amount of chemical in each of the bulk chemical tanks.

In the fixed/shuttle mode of operation, the controller will record transfers of the chemical from the shuttle tank B to the fixed tank A so that the production line operator can be made aware of the fact that the depleted shuttle tank B needs to be replaced by a filled shuttle tank C. An appropriate signal, either visual or audible, or both, can be used. As with the fixed/shuttle bulk chemical tank embodiment, when two shuttle bulk chemical tanks are used, each will be positioned on a scale, and both scales will be operably connected to the system controller so that the controller can selectively monitor the amount of chemical in each of the tanks.

As noted above, another operating protocol which can be used with the system of this invention is to use one of the shuttle tanks (tank A) to replenish the bubbler and use the other of the shuttle tanks (tank B) to replenish the bubbler when tank A has been emptied. When tank A has been emptied it will be replaced with another full shuttle tank (tank C), and when tank B has been emptied, it will be removed and replaced with tank D, while tank C takes over the replenishment of the bubbler. This protocol of using alternate shuttle tanks to replenish the bubbler provides a mode of operation which allows each shuttle tank to be cleaned and refilled after one cycle of bubbler replenishment. The same manifolding and valving system can be used for both the fixed/shuttle and the shuttle/shuttle protocols. Thus, the same cabinet and manifold can be used to operate in either of the two different modes, depending on which system is being used.

In either operating mode, when a tank in the system is replaced, the chemical transfer lines between the empty tank and the filled tank are flushed before the new tank is connected into the system. Both of the bulk chemical supply tanks, whether fixed or shuttle, are maintained at room temperature.

The system includes a manifold arrangement which incorporates a controller-operated chemical flow path scheme that can be selectively manipulated so as to provide the chemicals to the processing station and the bubbler in an appropriate manner in either the fixed/shuttle or the shuttle/shuttle operating modes. In the practice of this invention, the same controller hardware can be used, with appropriately programmed software, to operate either a fixed/shuttle, or a shuttle/shuttle system.

It is, therefore, an object of this invention to provide a procedure and apparatus for providing high purity processing chemicals to a component processing line.

It is an additional object of this invention to provide a procedure and apparatus of the character described wherein there are at least two bulk supply tanks of the processing chemicals on site at the processing line at all times to ensure continuous operation of the processing line.

It is a further object of this invention to provide a procedure and apparatus of the character described which is automatically operated by a microprocessor-controller which is programmed to operate the apparatus in more than one format.

It is a supplemental object of this invention to provide a properly programmed microprocessor-controller of the character described which can operate the apparatus with a protocol that uses one bulk supply tank as a fixed supply tank and another bulk supply tank as a shuttle supply tank; or can operate the apparatus with a protocol that uses each bulk supply tank as a shuttle supply tank.

It is yet another object of this invention to provide a system of the character described wherein both bulk supply tanks are mounted on scales so as to permit operation in either fixed/shuttle or shuttle/shuttle format.

These and other objects and advantages of the invention will become more readily apparent from the following detailed description of an embodiment thereof when taken in conjunction with the accompanying drawings.

DESCRIPTION OF EMBODIMENT OF THE INVENTION

Figure 1:
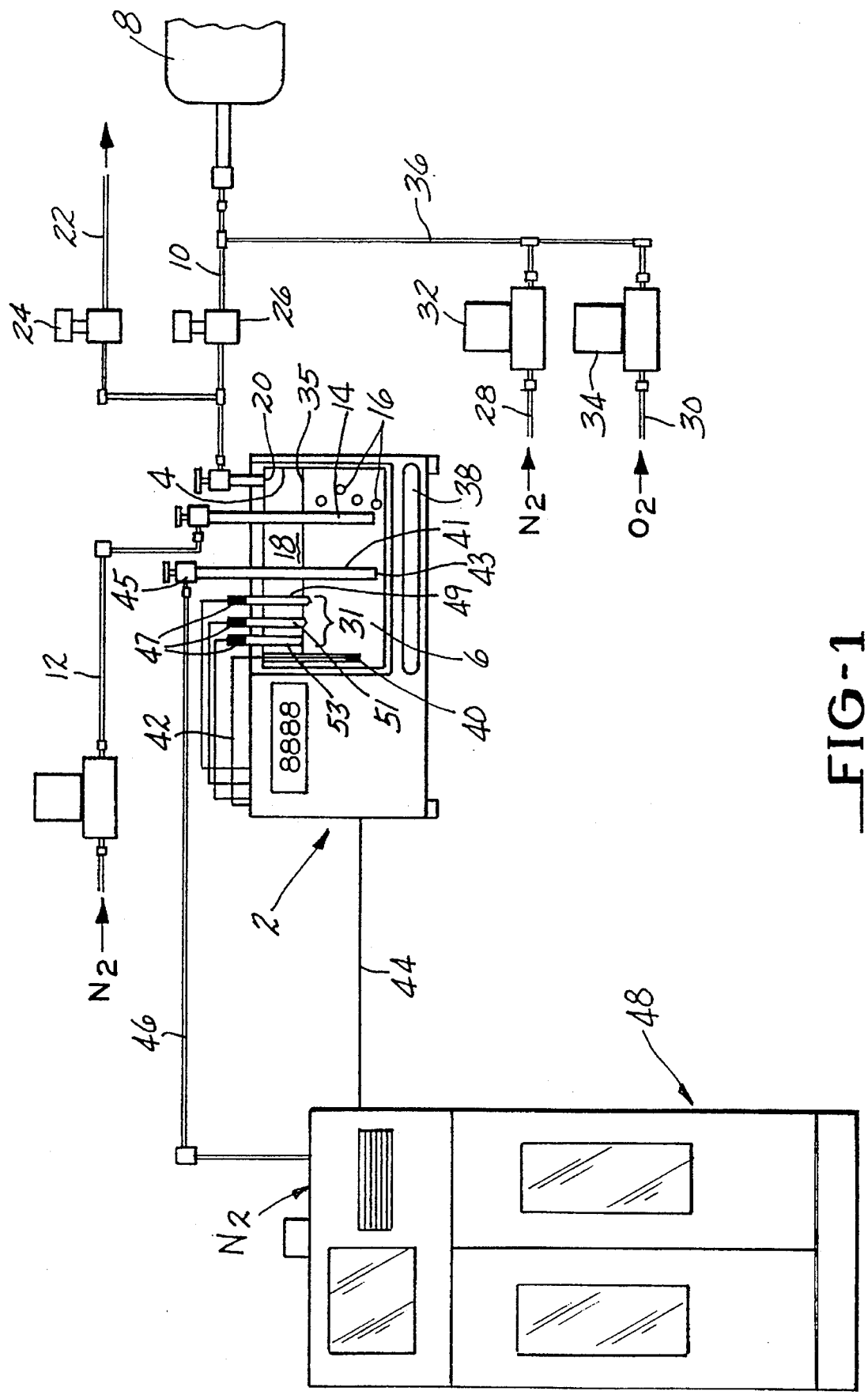
FIG. 1 is a schematic view of a production line which uses the system of this invention to dispense high purity chemicals into a processing station in the production line.

Referring now to the drawings, there is shown in FIG. 1 a schematic view of a high purity chemical dispensing system which forms a part of a production line for processing semiconductors, or the like. The dispensing system includes a chemical temperature controller 2 which contains a chemical supply ampule 4 from which the high purity chemical 6 is fed into a semiconductor-processing station 8 via conduit 10. In the system shown in FIG. 1, the chemical 6 is carried into the processing station 8 in a stream of an inert gas such as nitrogen. The nitrogen gas stream is fed into the chemical supply ampule 4 from a line 12 which opens into a tube 14 that extends below the surface of the chemical 6 in the ampule 4. The nitrogen gas stream forms an ascending flow of bubbles 16 which rises up through the liquid chemical 6 into the free space 18 in the ampule 4, and is operative to humidify and pressurize the free space 18, and create a pressurized, chemically-humidified stream of processing gas which flows out of the ampule 4 through an outlet 20 and into the line 10 to the processing station 8. A branch line 22 is used to temporarily exhaust the processing gas stream from the system during start-up of the process. Valves 24 and 26 are selectively operable to control the direction of flow of the processing gas stream. The composition of the atmosphere in the processing station 8 is controlled by gases admitted into the processing station 8 via lines 28, 30, and 36, which lines are regulated by gas mass flow controllers 32 and 34.

The temperature controller 2 includes a heater 38 which maintains the liquid chemical 6 in the ampule 4 at a proper operating temperature. A chemical temperature connected to temperature controller 2 via eletrical line 42 sensor 40, and chemical level sensor array 31 are disposed in the ampule 4.

The level 35 of the chemical in the ampule 4 is sensed in a manner which depends upon the material from which the ampule 4 is constructed. For example, when a quartz ampule is used, the level sensing is done by means of a beam emitter and vertically spaced-apart receivers which are located in the portion of the bubbler 2 where the ampule 4 is situated. One of the receivers is a start-refill receiver. The emitter sends a signal beam through the quartz ampule to respective receivers located on the opposite side of the ampule. When the liquid level is such that the emitter signal passes through the liquid, the index of refraction of the liquid causes the emitter beam to bend sufficiently so that the start-refill receiver will not "see" the emitter beam. So long as this condition persists, the ampule refill program will not be activated. When the liquid level falls below the emitter signal beam path, the start-refill receiver will sense the signal beam and will transmit a start-refill program-activation signal to the system controller.

In order to ensure that the proper amount of chemical has been added to the ampule during the refill operation, three liquid level sensors will preferably be provided in the system. The sensors are vertically spaced apart a predetermined distance. The lowest sensor is the "start refill" sensor. The intermediate sensor is a "stop refill" sensor, and the uppermost sensor is an "overfill" sensor. The stop refill sensor is operable to send a signal to the system controller indicating that the ampule has been properly refilled; and the overfill sensor acts as a backup for the stop refill sensor, and will activate an alarm in the case of an overfill condition. It will be understood that with the quartz ampule, the stop refill and the overfill sensors are operable to signal the system controller when the emitter beam is deflected by passing through the liquid chemical, while the start refill sensor is operable to signal the system controller when the emitter beam is not deflected by passing through the liquid chemical.

When the ampule 4 is stainless steel, the chemical level is preferably sensed by means of a series of probes which are denoted generally by the numeral 31, and which are inserted into the top of the ampule and extend into the ampule to the area where the chemical level is to be sensed. Each probe preferably consists of a quartz rod with a beveled end. Signal beam emitter/receiver components 47 are mounted on the top of each rod and send a signal beam down through each rod. The signal beams are reflected internally by the beveled ends of the rods when the chemical liquid level is below the ends of the rods. When the beveled end of a rod is immersed in the liquid chemical, the signal beam will be refracted out of the beveled end of the rod into the chemical, and will be scattered throughout the chemical. Thus, when the beveled end of a start-refill rod 49 is immersed in the chemical, its emitter/receiver 47 will not detect the light beam and will not activate the start-refill program. There are three chemical liquid level sensor probes, one 49 for detecting the start-refill level, one 51 for detecting the full level, and one 53 for detecting an overfill level. The emitter/receivers 47 are connected to control electronics (not shown) which are contained in the temperature controller 2. The aforesaid control electronics are connected to the system controller via line 44, the controller being housed in a cabinet 48 which also contains the purge gas and chemical supply manifolds and valves, and the bulk chemical supply tanks.

The controller microprocessor is a preprogrammed microprocessor that has inputted therein operating parameters for the system, and which is operable to moderate and control the various hardware components of the system so as to maintain proper chemical fill level in the reservoir ampule 4; proper operation of the various valves in the system; as well as additional scheduled proper operating parameters, as will be pointed out hereinafter. A programmable software package devised and marketed by Iconix Corp. of Foxboro, Mass. can be used to operate the controller.

Figure 2:
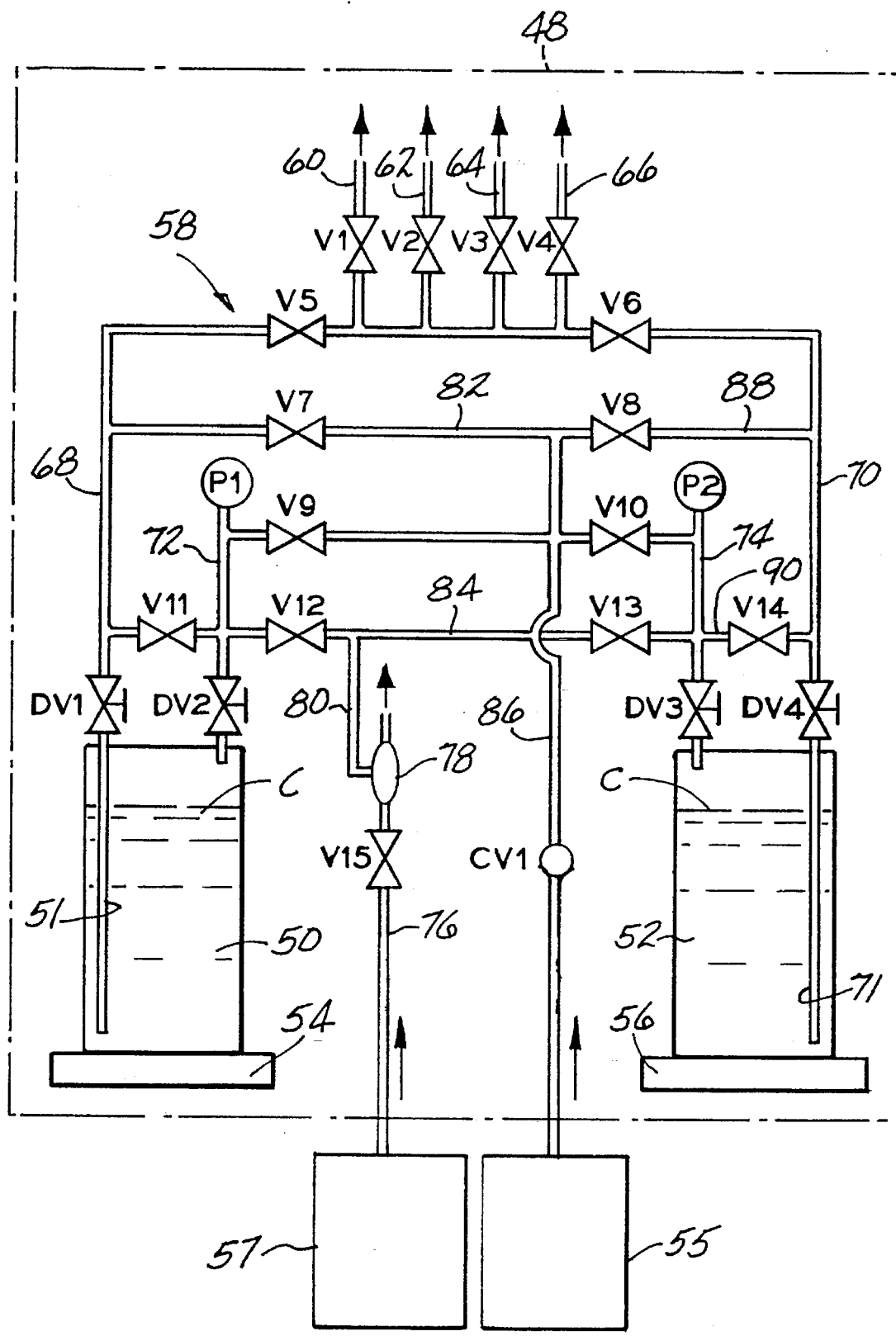
FIG. 2 is a schematic view of a dispensing line and valving system employed in conjunction with two bulk chemical supply tanks which allows the tanks to be used in the fixed/shuttle mode, or in the shuttle/shuttle mode.

Referring now to FIG. 2, there is shown in somewhat schematic fashion the bulk chemical supply tanks and the valving and conduit scheme for the purge gas and chemical refill manifold. The bulk chemical supply tanks are denoted by the numerals 50 and 52. One or both of them can be shuttle tanks. When only one tank is a shuttle tank, the other will be a fixed tank which is not designed to be removed from the cabinet 48. In either case, the cabinet 48 will be provided with two scales 54 and 56, one for each of the tanks 50 and 52. The cabinet assembly is thus capable of being used in a shuttle/shuttle mode, and is also capable of being used in a fixed/shuttle mode. The scales 54 and 56 monitor the amount of chemical which remains in each tank 50 and 52 at all times, and are operable to send appropriate signals to the controller so that the shuttle tank can be removed and replaced with a new shuttle tank in a manner which allows the production line to remain in continuous operation for an indeterminate time period.

The manifold is denoted generally by the numeral 58 and includes a plurality of outlet passages 60, 62, 64, and 66 which are connected to individual bubblers as described above. The outlet passages are each provided with individual control valves V1, V2, V3, and V4 respectively which are actuated by the system controller so that the chemical from the tanks 50 and 52 may be selectively transferred to bubblers which require chemical replenishment. Transfer passages 68 and 70 are operable to transfer chemical from the tanks 50 and 52 respectively to the outlet passages 60, 62, 64, and 66. Each of the transfer passages 68 and 70 is provided with respective valves V5 and V6 which are operable to control chemical flow from the tanks 50 and 52. The valves V5 and V6 are also actuated by the system controller. The chemical is forced out of the respective tanks 50 and 52 by means of a tank-pressurizing gas source 55. Pressure gauges P1 and P2 are used to monitor the gas pressure in the tanks 50 and 52 respectively. The gas source 55 is operable to selectively provide a pressurized stream of an inert dry gas such as helium or nitrogen to the tanks 50 and 52 through passages 72 and 74. The flow of pressurizing gas to the tanks 50 and 52 through the passages 72 and 74 is controlled in part by valves DV2 and DV3; and the transfer of chemical from tanks 50 and 52 to passages 68 and 70 is controlled in part by valves DV1 and DV4 respectively. The valves DV1, DV2, DV3 and DV4 are manually operated, and are kept open during normal system operation.

A second source of pressurized gas 57 is included in the system for use in applying a vacuum to the manifold assembly 58. The pressurized gas source 57 opens into a line 76 which is controlled by valve V15 and when the valve V15 is open, the gas stream passes through a venturi nozzle 78 so as to impose a vacuum in line 80 which opens into the venturi nozzle 78.

The following is a description of the valving sequence for transferring chemical from the tank 50 to one or more of the outlet passages 60, 62, 64 or 66. It will be understood that chemical can be similarly transferred from the tank 52 to the outlet passages 60, 62, 64, or 66 in the event that the system is used in the shuttle-shuttle mode, by manipulating the corresponding valves on the right side of FIG. 2. As previously noted, the valves DV1 and DV2 are kept open during normal operation of the system. One or more of the valves V1, V2, V3 or V4 will be opened along with the valves V5 and V9. The valve CV1 is a check valve which prevents back flow of gas into gas 55. All of the remaining valves except for DV3 and DV4 will be closed. Opening valve V9 allows the pressurizing gas from source 55 to enter the tank 50, pressurizing the latter sufficiently to force the chemical C up through the tube 50 into line 68 and out through the opened outlet passages. The chemical is transferred to the bubbler ampule 4 through a line 46 which connects with an extended tube 41 via a valve 45 which remains open at all times during normal operation of the system. The transferred chemical enters the ampule 4 through the open end 43 of the tube 41 (see FIG. 1). When the appropriate fill level is detected in the ampule, the controller automatically closes the valves V5 and V9 along with the opened outlet valve. As previously noted, the scale 54 monitors the amount of chemical remaining in the tank 50, and when the chemical amount reaches a predetermined minimal amount, the controller will provide a signal to the system operator that the tank is to be removed from the cabinet 48 when the system is a shuttle/shuttle system.

When the system is operating in a fixed/shuttle mode, if the tank 50 is the fixed tank and the tank 52 is the shuttle tank, the scale 54 will signal the controller when the chemical level in the tank 50 has reached a refill level, preferably about 75% of capacity, and the controller will open the correct valves in the system so as to effect a transfer of chemical from the tank 52 to the tank 50. Assuming at this point that all of the valves except DV1, DV2, DV3, and DV4 are closed, the controller will open valves V10, V5, and V6. This will cause the pressurized gas from source 55 to pressurize the tank 52 to the extent needed to force the chemical C up through the tube 71 into the passage 70 and through the valves V5 and V6 to the line 68. The chemical then flows down through the line 68 into the tube 51 and into the tank 51. When the scale 54 signals that sufficient chemical has been transferred into the tank 52, the controller closes the valves V10, V5, and V6 to halt movement of the chemical from tank 52 to 50. Obviously, if the tank 52 were the fixed tank and tank 50 were the shuttle tank in a fixed-shuttle system, the transfer would involve manipulation of the valve V9 rather than the valve V10. The other operative valves would remain the same.

In both the fixed/shuttle and shuttle/shuttle modes of operation, there will be an operating protocol for exchanging an empty tank for a full tank. The following is an explanation of the aforesaid protocol. The empty tank to be replaced will be the shuttle tank in the fixed/shuttle mode, and alternating ones of the tanks in the shuttle/shuttle mode. Assuming that tank 52 is the tank to be replaced with a full tank, the controller will be signaled by the scale 56 that the tank 52 is empty, i.e., that the chemical level is below the lower end of the tube 71.

The general protocol for exchanging empty bulk containers is as follows:

1) blowing out the lines of the manifold associated with the bulk container being replaced;

2) purging the lines of the manifold associated with the bulk container being replaced;

3) flushing inert gas through the connection lines while they are being disconnected from the empty bulk container and then reconnected to the new bulk container;

4) purging the lines again; and 5) leak checking the connections.

"Blowing out" refers to the removal of liquid in lines of the manifold when the latter are full of chemical. "Purging" refers to the removal of any residual liquid remaining in the lines after the "blowing out" operation. "Flushing" refers to the constant flow of gas through the lines to eliminate line contamination which connections are being made.

Specific details are as follows: To start the changeover sequence, the controller will open the valve V15 so as to direct a stream of compressed gas through the venturi 78. This will draw a vacuum in the line 80 and in line 84. The valve V13 is opened to extend the vacuum to the tank 52. The valve V8 is opened to direct a stream of pressurized gas from the gas source 55 into lines 86, 88, and 70. The gas stream from the source 55 thus sweeps through the lines 88 and 70 as well as the tube 71 and tank 52 and thence through the lines 84 and 80 and into the venturi 78. The dry gas from the source 55 will cause any residual chemical in the lines 88 and 70 to be transferred into the tank 52. The aforesaid valving condition will be maintained for a predetermined time period needed to purge the lines of residual chemical. After the lines have been purged of residual chemical, all automatic valves are closed and the system operator is instructed to close the manual valves DV3 and DV4 on top of the tank 52.

After the system operator signals the system controller that the valves have been closed, the controller will open the valve V15 so as to direct a stream of compressed gas through the venturi 78. This will draw a vacuum in the line 80 and in line 84. The valves V13 and V14 are opened to extend the vacuum to the lines 74, 90, 70, 88, and on tank valves DV3 and DV4. The aforesaid valving condition will be maintained to apply vacuum to the lines and on the tank valves for a predetermined time period. Next, valves V15 and V13 are closed and the valve V8 is opened to direct a stream of pressurized gas from the gas source 55 into lines 86, 88, 70, 90, and 74. The gas stream from the source 55 thus applies pressure to the lines 88, 70, 90, and 74 as well as on the tank valves DV3 and DV4 for a predetermined time period.

The above purge cycle of alternately applying vacuum and pressure on the lines and on the tank valves is repeated for the desired number of cycles, typically about ten. Once the necessary purge cycles have been completed, all automatic valves are closed and the controller will open valves V8 and V10 to allow gas to flow through lines 70 and 74 while the tank is being replaced. The aforesaid prevents air from entering the flexible connection lines while the tank is being removed and a new tank is being installed. The system operator will be instructed to remove the tank 52 from the cabinet 48 and to install a full replacement tank. After the system operator has indicated that a new tank has been installed valves V8 and V10 are closed. The controller then opens valve V15 so as to direct a stream of compressed gas through the venturi 78. This will draw a vacuum in the lines 80 and 84. The valves V13 and V14 are opened to extend the vacuum to the lines 74, 90, 70, 88, and to the tank valves DV3 and DV4. After sufficient vacuum time, the controller closes valves V13 and V15. The controller then monitors the pressure on the lines and valves DV3 and DV4 by means of pressure gauge P2, which is a pressure transducer, as is pressure gauge P1. A rise in pressure would indicate a leak in the connections to the new tank. If no leaks are detected, the system repeats the above purge cycles and returns. The operator will manually return the system to automatic operation, which will operate as outlined above.

It is noted that the above described replacement/purge procedure will occur when an empty tank is replaced with a full tank, irrespective of whether the system is operating in the fixed/shuttle, or the shuttle/shuttle mode. In order to operate the system controller in the preprogrammed operating mode, i.e., either the fixed/shuttle, or the shuttle/shuttle operating mode, the system operator need only activate the controller to reassume automatic operation of the system, which is accomplished by means of the keyboard provided in the system.

Figure 3:
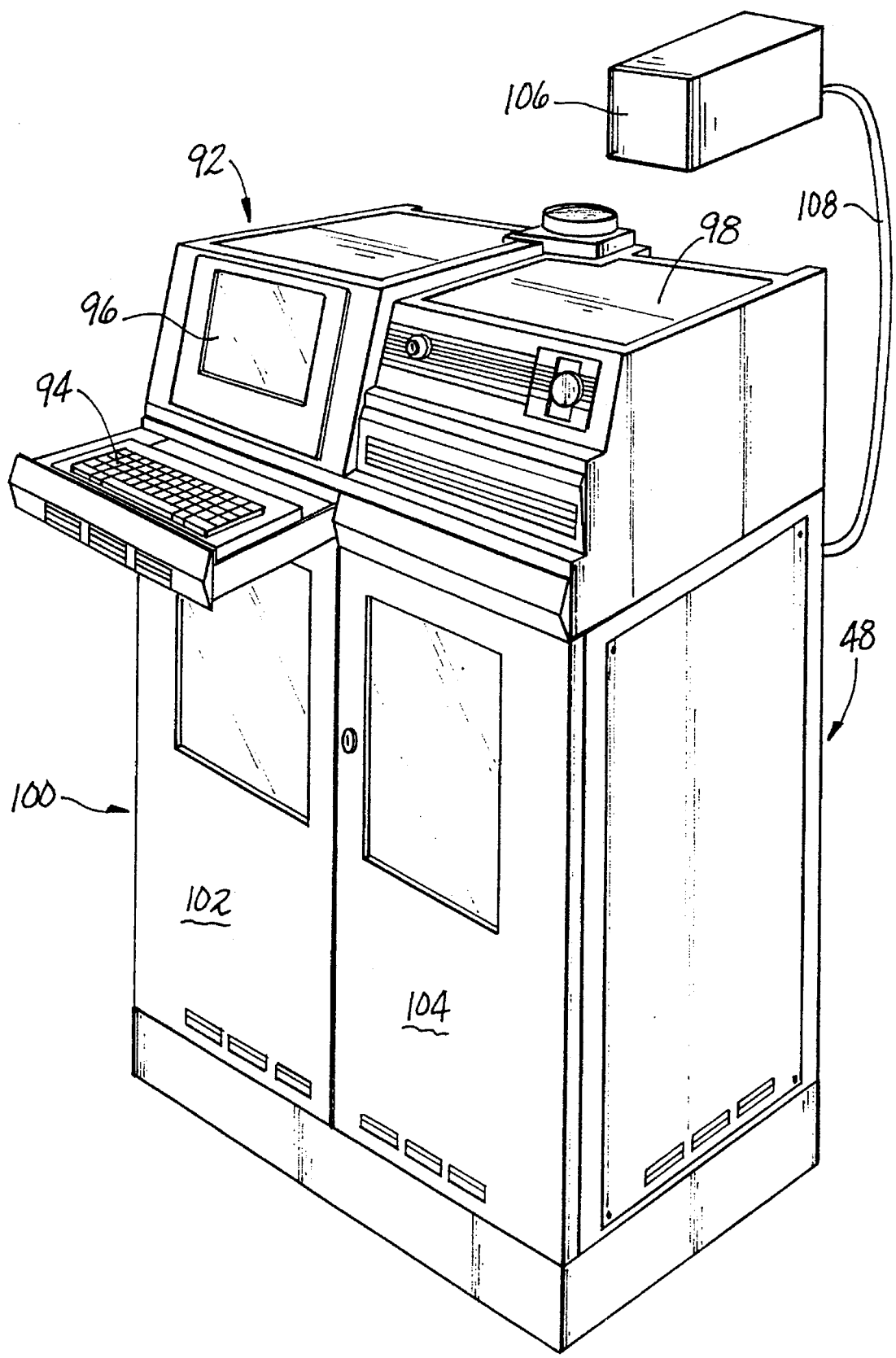
FIG. 3 is a perspective view of a cabinet used to house the bulk supply tanks, the microprocessor controller, and the valved dispensing manifold used in accordance with this invention.

Referring now to FIG. 3, details of the cabinet 48 are shown. The cabinet 48 includes a microprocessor controller section 92 which includes a keyboard 94 and a monitor 96 which are contained in the electrical section 98 of the cabinet, which cabinet section houses the electrical components of the system. The lower portion 100 of the cabinet contains the two bulk chemical supply tanks 50 and 52 and has a pair of side-by-side doors 102 and 104 which allow access to the bulk supply tanks. The lower portion 100 of the cabinet 48 contains all of the aforesaid chemical and operating fluid flow control manifold and valves. The valves are preferably pneumatic valves which are operated by a source of pressurized air 106 that is located externally of the cabinet 48 and is connected to the manifold system via line 108. Control of compressed air flow through the line 108 is accomplished via electrical solenoid valves contained in the electrical section 98. The sources of pressurized gas 55 and 57 shown in FIG. 2 are located externally of the cabinet 48.

Figure 4:
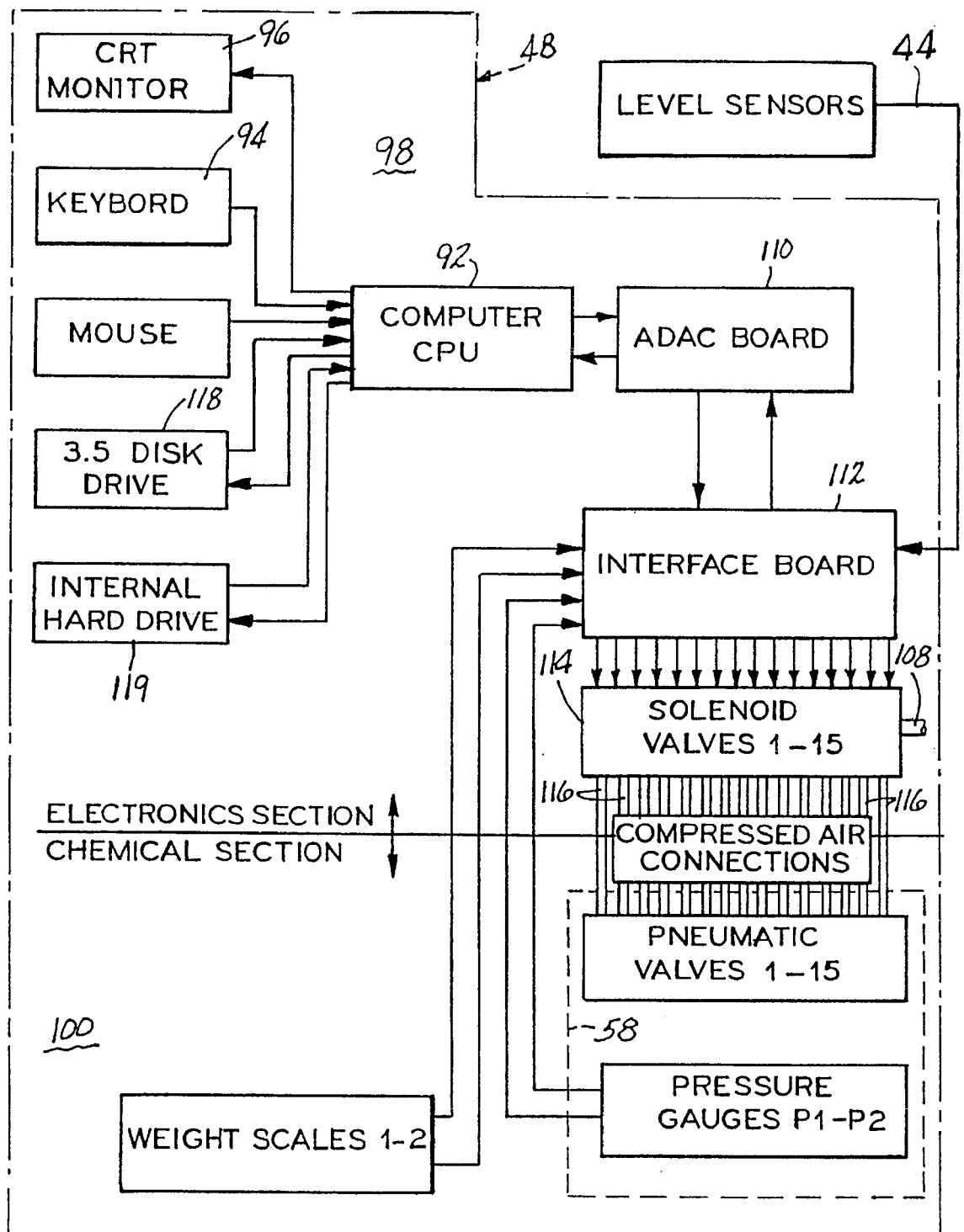
FIG. 4 is a schematic view of the system controller and valve network, showing particularly the electrical and chemical sections of the system which are contained in the cabinet.

Referring now to FIG. 4, there is shown a block diagram of the electrical 98 and chemical 100 sections in the cabinet 48 which are used to operate the system. The upper electrical section 98 of the system includes the controller computer CPU components such as the monitor 96, the keyboard 94, a mouse, a floppy disc drive 118, and a hard drive. The controller 92 is connected to an analog to digital controller board 110 which takes the analog signals from an interface board 112 that controls the operation of the solenoid valves in valve manifold 114, and converts the analog signals into digital signals for the controller computer. The interface board 112 is also connected to and receives signals from both of the bulk tank scales or weight sensors; from the ampule fill level sensors via line 44; and from the pressure gauges P1 and P2. The solenoid valve manifold 114 receives compressed air from the line 108 and selectively delivers the compressed air to the above-described pneumatic valves contained in the manifold assembly 58 via individual tubular connections 116. Thus, one solenoid valve is operably paired with a respective one of the pneumatic valves in the manifold 58. Depending on input received from start/stop signals, the weight scales and the pressure gauges, as well as operator input from the keyboard or mouse, the controller 92 dictates operation of the solenoid valves in manifold 114, and, therefore, the pneumatic valves V1–V15 in manifold 58. The controller 92 will also signal and prompt the system operator via the monitor 96 as to tasks which must be manually performed. The floppy disc drive 118 contains a disc on which run information is logged, and the floppy disc drive 118 is also used to transfer program information to the hard drive. The hard drive 119 is programmed to operate the system in either a fixed/shuttle or a shuttle/shuttle mode.

It will be readily appreciated that the same system manifolding containing identical electrical and chemical components when constructed in accordance with this invention will be able to operate in either of two different modes. The only difference will be the operating program contained in a hard drive in the controller computer. Thus a system constructed in accordance with this invention will be usable in a preexisting processing plant which uses either the fixed/shuttle or shuttle/shuttle operating mode. The increased versatility of the system of this invention will eliminate the need for custom manifolding in a chemical delivery assembly which manifolding is dependent upon the mode of operation of the processing plant.

Since many changes and variations of the disclosed embodiment of the invention may be made without departing from the inventive concept, it is not intended to limit the invention otherwise than as required by the appended claims.

While the invention has been described above with reference to specific embodiments thereof, it is apparent that many changes, modifications, and variations can be made without departing from the inventive concept disclosed herein. Accordingly, it is intended to embrace all such changes, modifications, and variations that fall within the spirit and broad scope of the appended claims. All patent applications, patents, and other publications cited herein are incorporated by reference in their entirety.

What is claimed is:

1. A system for transferring liquid chemicals from a bulk supply thereof to a chemical application station, said system comprising:

a) a plurality of pressurized bulk chemical supply tanks;

b) a volume sensor associated with each of said bulk chemical supply tanks, said volume sensors being operable to monitor the volume of chemical remaining in each of said bulk chemical supply tanks;

c) a chemical supply ampule for receiving chemical from said bulk chemical supply tanks, said ampule being operable to feed chemical to said application station;

d) level detectors associated with said ampule and operable to detect chemical levels in said ampule;

e) a chemical flow path-controlling manifold interconnecting said bulk chemical supply tanks with each other and with said ampule, said manifold including: a first chemical transfer line between said bulk chemical supply tanks; a second chemical transfer line between one of said bulk chemical supply tanks and said ampule; and a third chemical transfer line between another of said bulk chemical supply tanks and said ampule;

f) a plurality of valves in said manifold for selectively opening said first, second or third chemical transfer lines so as to transfer chemical from one of said bulk chemical supply tanks through said first, second or third chemical transfer lines; and g) microprocessor controller means for selectively operating said system in a fixed/shuttle mode which mode involves the use of a fixed bulk chemical supply tank and the use of a shuttle bulk chemical supply tank, or in a shuttle/shuttle mode which mode involves the use of a plurality of shuttle bulk chemical supply tanks:

h) said microprocessor controller means being programmed, when operating the system in the fixed/shuttle mode: to periodically actuate said valves to open said first chemical transfer line upon receipt of a predetermined signal from one of said volume sensors indicating a need-to-add volume of chemical in the fixed bulk chemical supply tank, and to periodically actuate said valves to open said second chemical transfer line between said fixed bulk chemical supply tank and said ampule upon receipt of a predetermined signal from said level detectors indicating a need-to-add level of chemical in said ampule, and to keep said valves in a condition which holds said third chemical transfer line in a closed condition; and i) said microprocessor controller means further being programmed, when operating the system in the shuttle/shuttle mode, to periodically actuate said valves to open one of said second and third chemical transfer lines upon receipt of said need-to-add level of chemical signal from said level detectors and, after receipt of a tank-empty signal from one of said volume sensors, to periodically subsequently actuate said valves to open the other of said second and third chemical transfer lines upon receipt of subsequent need-to-add level of chemical signals from said level detectors, and to keep said valves in a condition which holds said first chemical transfer line in a closed condition.

2. The system of claim 1 further comprising means operable to draw a vacuum on an empty bulk chemical supply after receipt of said tank-empty signal, and operable to remove residual chemical from lines connected to an empty tank and from the empty tank prior to removal of the empty tank from the system.

3. The system of claim 2 further comprising means operable to test the system and a newly installed bulk chemical supply tank for leaks prior to placing the newly installed tank into service in the system.

* * * * *